(12) United States Patent
Sakaue et al.

(10) Patent No.: US 8,545,160 B2
(45) Date of Patent: Oct. 1, 2013

(54) SUBSTRATE TRANSFER APPARATUS AND SUBSTRATE TRANSFER METHOD

(75) Inventors: Hiromitsu Sakaue, Yamanashi (JP); Hirofumi Yamaguchi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 712 days.

(21) Appl. No.: 12/715,497

(22) Filed: Mar. 2, 2010

(65) Prior Publication Data

US 2010/0226737 A1 Sep. 9, 2010

(30) Foreign Application Priority Data

Mar. 3, 2009 (JP) ................................. 2009-049118

(51) Int. Cl.
*H01L 21/677* (2006.01)

(52) U.S. Cl.
USPC .......................................... 414/217; 414/937

(58) Field of Classification Search
USPC .................................. 414/217, 937
See application file for complete search history.

(56) References Cited

U.S. PATENT DOCUMENTS

| | | | | |
|---|---|---|---|---|
| 5,183,370 A | * | 2/1993 | Cruz | 414/416.03 |
| 5,613,821 A | * | 3/1997 | Muka et al. | 414/217.1 |
| 6,048,154 A | * | 4/2000 | Wytman | 414/217 |
| 6,450,750 B1 | * | 9/2002 | Heyder et al. | 414/217 |
| 6,719,517 B2 | * | 4/2004 | Beaulieu et al. | 414/217 |
| 6,837,663 B2 | * | 1/2005 | Mages et al. | 414/411 |
| 2006/0251499 A1 | * | 11/2006 | Lunday et al. | 414/217 |

FOREIGN PATENT DOCUMENTS

| | | |
|---|---|---|
| JP | 03-254119 A | 11/1991 |
| JP | 05-275511 A | 10/1993 |
| JP | 2001-319958 A | 11/2001 |
| JP | 2003-045931 A | 2/2003 |
| JP | 2004-182475 A | 7/2004 |

* cited by examiner

*Primary Examiner* — Jonathan Snelting
(74) *Attorney, Agent, or Firm* — Pearne & Gordon LLP

(57) ABSTRACT

A substrate transfer apparatus that transfers a substrate with respect to a processing apparatus includes a substrate accommodation unit for accommodating a plurality of substrates to be loaded into the processing apparatus in a vertical direction in a multi-stage; a substrate accommodation unit for accommodating a plurality of substrates unloaded from the processing apparatus in a vertical direction in a multi-stage; a substrate holder for transferring the substrates from the substrate accommodation unit to the processing apparatus; a substrate holder for transferring the substrates from the processing apparatus to the substrate accommodation unit. The substrate accommodation unit has an elevating mechanism for moving at least one of the substrate and the substrate holder in a vertical direction relative to each other and the substrate accommodation unit has an elevating mechanism for moving at least one of the substrate and the substrate holder in a vertical direction relative to each other.

7 Claims, 17 Drawing Sheets

SUBSTRATE TRANSFER APPARATUS AND SUBSTRATE TRANSFER METHOD

FIELD OF THE INVENTION

The present disclosure relates to a substrate transfer apparatus and a substrate transfer method for loading and unloading a substrate into/from a processing apparatus in which a predetermined process is performed on the substrate.

BACKGROUND OF THE INVENTION

In a manufacturing process of, e.g., a semiconductor device, various processes such as an ion implanting process, an etching process and a film forming process are performed on a substrate. When performing these processes, a so-called multi-chamber type substrate processing system having a plurality of processing apparatuses is used in order to achieve consistency, connectivity or integration of the processes.

Installed in the multi-chamber type substrate processing system are a substrate accommodation vessel that receives, in a height direction, a plurality of substrates loaded or unloaded into/from the processing apparatus and a transfer apparatus that transfers the substrates between the processing apparatus and the substrate accommodation vessel. The transfer apparatus has a transfer arm capable of revolution, expansion/contraction or elevation, so that a substrate holder of the transfer arm can take out or put in a single sheet of substrate at each height by accessing an opening of the substrate accommodation vessel. Further, the substrate holder can load and unload each substrate into/from the processing apparatus installed opposite to the substrate accommodation vessel across the transfer apparatus by accessing the processing apparatus.

However, when replacing a processed substrate with an unprocessed substrate in such a substrate processing system, the processing apparatus is in a standby state, i.e., in a non-operating state. Therefore, in order to improve throughput of the substrate processing system, it is important to reduce time required for transferring a substrate between the processing apparatus and the substrate accommodation vessel or time required for changing the substrates in the processing apparatus. Conventionally, as disclosed in, for example, Patent Document 1, a loading arm for loading a substrate and an unloading arm for unloading a processed substrate from a processing apparatus are separately and independently installed, and, thus, the loading arm can load an unprocessed substrate to a processing apparatus' empty space from which the unloading arm has just unloaded a substrate. In this way, since the loading arm and the unloading arm are independently installed, it is possible to reduce time required for changing substrates in a processing apparatus, in particular, in a batch-type processing apparatus capable of performing a batch process on a plurality of substrates, whereby throughput can be improved.

Patent Document 1: Japanese Patent Laid-open Publication No. H3-254119

BRIEF SUMMARY OF THE INVENTION

However, in the batch-type processing apparatus as disclosed in Patent Document 1, there has been a problem that it takes a long time to change all substrates in the processing apparatus due to a complicated transfer path between the substrate accommodation vessel and the processing apparatus. To be specific, when the substrate is transferred from a buffer area to a mounting table in the processing apparatus, a transfer arm should carry out the following operations: (1) an expanding/contracting operation and an elevating operation to receive the substrate from the buffer area; (2) a revolving operation toward the processing apparatus from the buffer area; and (3) an expanding/contracting operation to transfer the substrate to the processing apparatus, so that it takes a long time to transfer one substrate.

In view of the foregoing, the present disclosure is provided to improve throughput of the substrate processing system including a batch-type processing apparatus.

In accordance with an aspect of the present disclosure, there is provided a substrate transfer apparatus that transfers a substrate with respect to a batch-type processing apparatus for performing a batch process on a plurality of substrates. The substrate transfer apparatus includes: a first substrate accommodation unit configured to accommodate a plurality of substrates to be loaded into a processing apparatus in a vertical direction in a multi-stage; a second substrate accommodation unit configured to accommodate a plurality of substrates unloaded from the processing apparatus in a vertical direction in a multi-stage; a first substrate holder configured to transfer the substrates from the first substrate accommodation unit to the processing apparatus; a second substrate holder configured to transfer the substrates from the processing apparatus to the second substrate accommodation unit; a first elevating mechanism configured to move at least one of the substrate in the first substrate accommodation unit and the first substrate holder in a vertical direction relative to each other, and transfer the substrates between the first substrate accommodation unit and the first substrate holder; and a second elevating mechanism configured to move at least one of the substrate in the second substrate accommodation unit and the second substrate holder in a vertical direction relative to each other, and transfer the substrates between the second substrate accommodation unit and the second substrate holder. In this case, the meaning of the expression of "moving at least one of the substrate and the substrate holder in a vertical direction relative to each other" implies, for example, moving the substrate up and down while fixing the position of the substrate holder; moving the substrate holder up and down while fixing the position of the substrate; or moving both the substrate holder and the substrate up and down.

In accordance with the present disclosure, the first substrate accommodation unit for accommodating the plurality of substrates to be loaded into the processing apparatus and the first substrate holder for loading the substrate in the first substrate accommodation unit into the processing apparatus are independently installed from the second substrate accommodation unit for accommodating the plurality of substrates unloaded from the processing apparatus and the second substrate holder for unloading the processed substrate from the processing apparatus and accommodating the plurality of substrates in the second substrate accommodation unit. Accordingly, each of the substrate holders can be moved along a straight transfer route between each substrate holder and the processing apparatus. Further, since the substrate can be transferred between the respective substrate holders and the respective substrate accommodation units by moving at least one of the respective substrate holders and the respective substrate accommodation units in a vertical direction relative to each other, a revolving operation of the substrate holder, which has been necessary in a conventional transfer apparatus, becomes unnecessary.

Further, the unprocessed substrate to be loaded into the processing apparatus passes through the first substrate accommodation unit and the first transfer mechanism, and the processed substrate unloaded from the processing apparatus passes through the second substrate accommodation unit and the second transfer mechanism. Accordingly, a time for transferring the substrate between the processing apparatus and the substrate accommodation unit can be reduced and thus throughput of the substrate processing system can be improved.

In the first substrate accommodation unit, a support for supporting the substrate may be installed at a position where it is not overlapped with the first substrate holder when viewed from the top, and in the second substrate accommodation unit, a support for supporting the substrate may be installed at a position where it is not overlapped with the second substrate holder when viewed from the top.

The first elevating mechanism may move the first substrate accommodation unit in a vertical direction, and the second elevating mechanism may move the second substrate accommodation unit in a vertical direction. In this case, the first substrate accommodation unit and the second substrate accommodation unit may move in a reverse direction to each other in a vertical direction. Further, the first elevating mechanism and the second elevating mechanism may constitute a single elevating mechanism, and the single elevating mechanism may include a driving force transmission mechanism for dividing and transmitting its driving force to the first substrate accommodation unit and the second substrate accommodation unit.

Further, the first substrate accommodation unit may include a first support moving mechanism that moves the support between an inner side and an outer side of the substrate, and the second substrate accommodation unit may include a second support moving mechanism that moves the support between an inner side and an outer side of the substrate. The first elevating mechanism may move the first substrate holder in a vertical direction, and the second elevating mechanism may move the second substrate holder in a vertical direction. Furthermore, the substrate transfer apparatus may be further include a first supporting pin configured to support the substrate in the first substrate accommodation unit; and a second supporting pin configured to support the substrate in the second substrate accommodation unit. The first substrate accommodation unit may include a first support moving mechanism that moves the support between an inner side and an outer side of the substrate, and the second substrate accommodation unit may include a second support moving mechanism that moves the support between an inner side and an outer side of the substrate. The first elevating mechanism may move the first supporting pin in a vertical direction, and the second elevating mechanism may move the second supporting pin in a vertical direction.

The processing apparatus may include a processing chamber in which a predetermined process is performed on a plurality of substrates under a depressurized atmosphere. The substrate transfer apparatus may be positioned in a transfer chamber capable of being depressurized inside, and the transfer chamber may have an opening through which the transfer chamber communicates airtightly with the processing chamber.

In such a case, at a position below the substrate loaded by the first substrate holder and a position below the substrate to be unloaded by the second substrate holder, respectively, in the processing chamber, supporting devices each supporting the substrate may be installed, and the supporting devices may be movable in a vertical direction.

The substrate transfer apparatus may further include: a first moving mechanism configured to move the first substrate holder between above a position where the substrate is mounted in the processing chamber and below the substrate in the first substrate accommodation unit; and a second moving mechanism configured to move the second substrate holder between above a position where the substrate is received in the processing chamber and below the substrate in the second substrate accommodation unit. Each of the first substrate accommodation unit and the second substrate accommodation unit may include a dummy wafer mounting portion that mounts a dummy wafer on its upper portion.

In accordance with another aspect of the present disclosure, there is provided a substrate processing system including: a plurality of substrate transfer apparatuses; a transfer chamber configured to transfer substrates to the plurality of substrate transfer apparatuses; and a batch-type processing apparatus connected to each of the plurality of substrate transfer apparatuses.

In accordance with a still another aspect of the present disclosure, there is provided a substrate transfer method that transfers a substrate with respect to a processing apparatus for performing a predetermined process on a substrate. Further, the substrate transfer method is performed in a substrate transfer apparatus including: a first substrate accommodation unit configured to accommodate a plurality of substrates to be loaded into a processing apparatus in a vertical direction in a multi-stage; a second substrate accommodation unit configured to accommodate a plurality of substrates unloaded from the processing apparatus in a vertical direction in a multi-stage; a first transfer mechanism configured to load the substrates in the first substrate accommodation unit into the processing apparatus by a first substrate holder; a second transfer mechanism configured to unload the processed substrates from the processing apparatus by a second substrate holder and accommodate the processed substrates in the second substrate accommodation unit; a first elevating mechanism configured to move at least one of the substrate in the first substrate accommodation unit and the first substrate holder in a vertical direction relative to each other; and a second elevating mechanism configured to move at least one of the substrate in the second substrate accommodation unit and the second substrate holder in a vertical direction relative to each other. Furthermore, in the first substrate accommodation unit, a support for supporting the substrate is installed at a position where it is not overlapped with the first substrate holder when viewed from the top, and in the second substrate accommodation unit, a support for supporting the substrate is installed at a position where it is not overlapped with the second substrate holder when viewed from the top. Furthermore, the transfer of the substrate between the first substrate accommodation unit and the first substrate holder and between the second substrate accommodation unit and the second substrate holder is carried out by moving at least one of the first substrate accommodation unit and the first substrate holder in a vertical direction relative to each other and by moving at least one of the second substrate accommodation unit and the second substrate holder in a vertical direction relative to each other.

In accordance with the present disclosure, it is possible to improve throughput of the substrate processing system by reducing time for transferring the substrate between the processing apparatus and the substrate accommodation unit.

BRIEF DESCRIPTION OF THE DRAWINGS

The disclosure may best be understood by reference to the following description taken in conjunction with the following figures.

DETAILED DESCRIPTION OF THE INVENTION

Figure 1:
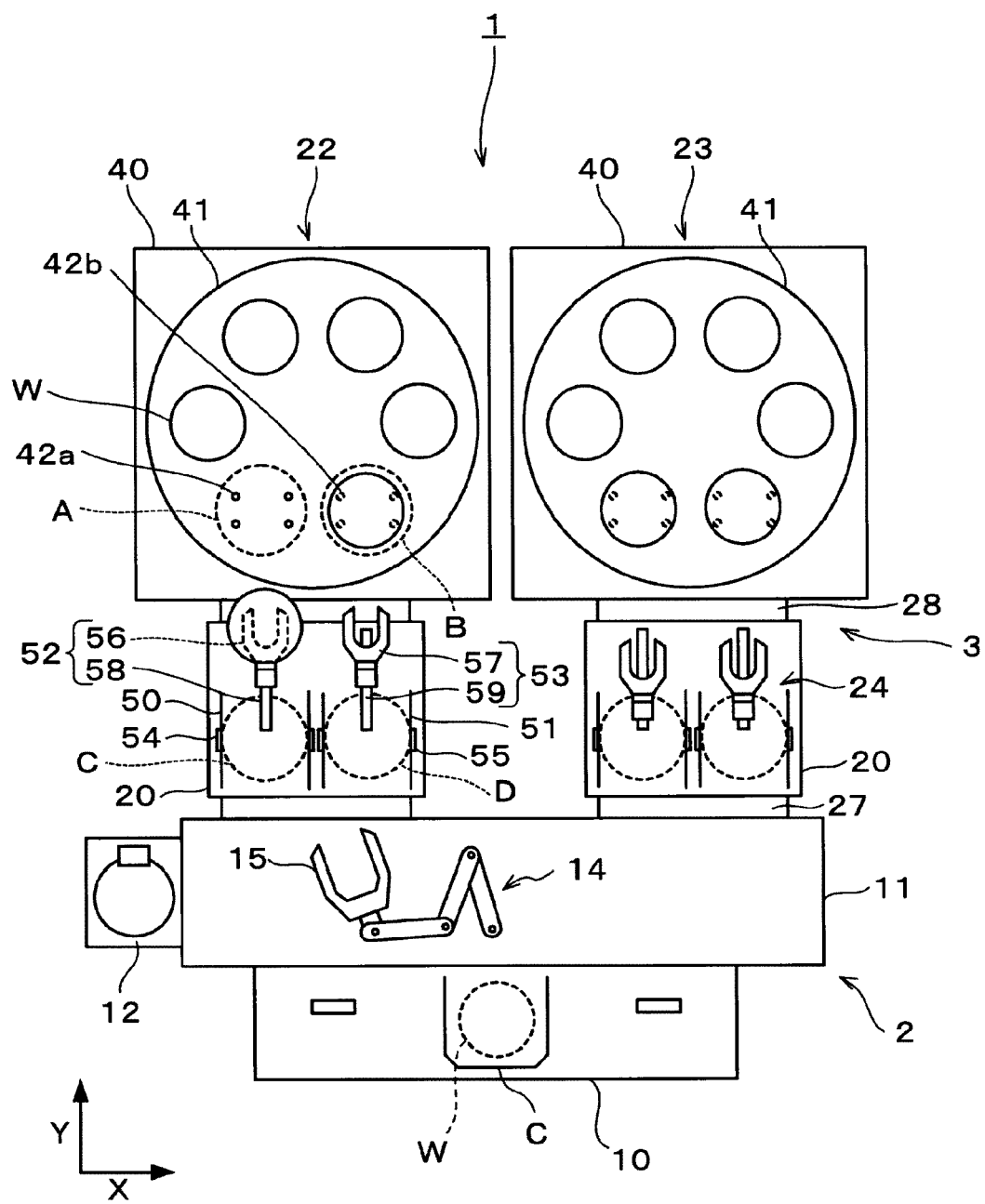
FIG. 1 is a plane view showing a schematic configuration of a substrate processing system in accordance with the present embodiment.

Hereinafter, embodiments of the present disclosure will be described. FIG. 1 is a plane view showing a schematic configuration of a substrate processing system 1 including a substrate transfer apparatus in accordance with the present embodiment. Further, a semiconductor wafer, for example, is used as a substrate W of the present embodiment.

The substrate processing system 1 includes, as illustrated in FIG. 1, a cassette C serving as a substrate receiving vessel that receives a plurality of substrates W; a cassette station 2 where the plurality of substrates W stored in the cassette C is loaded and unloaded; and a processing station 3 including a plurality of processing apparatuses capable of performing, e.g., a batch process on the plurality of substrates W are connected as one body.

The cassette station 2 includes a cassette mounting unit 10, a transfer chamber 11 arranged adjacent to the cassette mounting unit 10, and an alignment unit 12 that is arranged adjacent to the transfer chamber 11 and adjusts a position of the substrate W. The cassette mounting unit 10 is configured to mount a plurality of, e.g., three, cassettes C, each capable of receiving a plurality of substrates W, in parallel in an X-axis direction (right and left directions in FIG. 1). Installed in the transfer chamber 11 is a substrate transfer device 14. The substrate transfer device 14 has a multi-joint arm 15 capable of revolution, expansion/contraction, and elevation and is configured to transfer the substrate W to the cassette C in the cassette mounting unit 10, the alignment unit 12, and substrate accommodation units 50 and 51, which will be described later, installed in the processing station 3.

The processing station 3 includes two load lock chambers 20 serving as transfer chambers capable of being depressurized inside; processing apparatuses 22 and 23 for performing a batch process on the plurality of substrates W; and a substrate transfer apparatus 24 for transferring a substrate between the load lock chamber 20 and each of the processing apparatuses 22 and 23. The load lock chamber 20 is positioned between the transfer chamber 11 and each of the processing apparatuses 22 and 23 and connects the transfer chamber 11 with each of the processing apparatuses 22 and 23. The substrate transfer apparatus 24 is positioned inside the load lock chamber 20.

Figure 2:
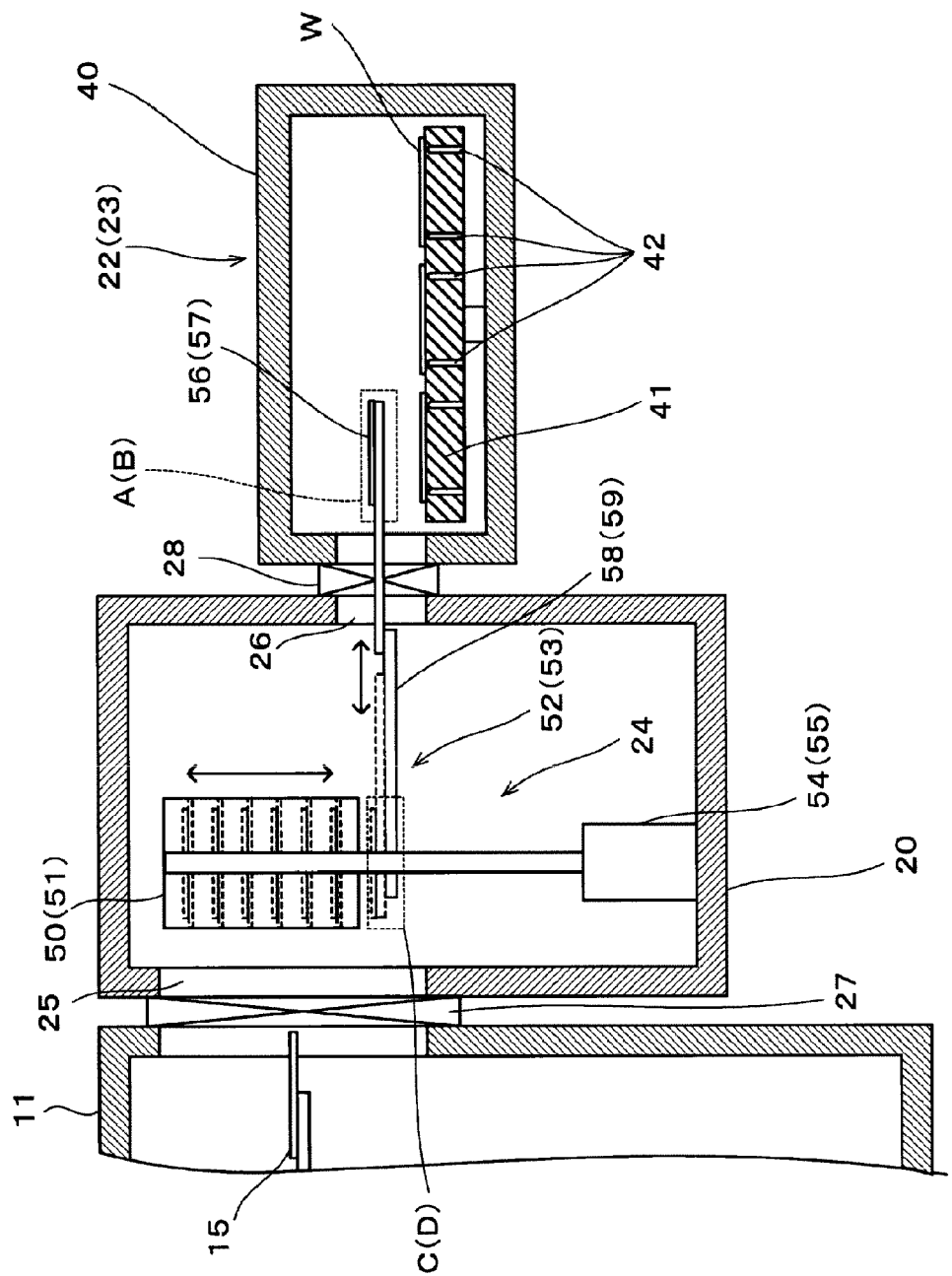
FIG. 2 is a longitudinal cross-sectional view showing a schematic configuration of a substrate transfer apparatus and a processing apparatus.

As illustrated in FIG. 2, provided at both sides of the load lock chamber 20 are an opening 25 through which the substrate W is transferred into the load lock chamber 20 by the arm 15, and an opening 26 through which the substrate W is transferred between the load lock chamber 20 and the processing chamber 22 (23) by the substrate transfer apparatus 24. Installed at a position corresponding to the opening 25 between the transfer chamber 11 and the load lock chamber 20, and at a position corresponding to the opening between the load lock chamber 20 and the processing chamber 22 (23) are gate valves 27 and 28, respectively, which provide an airtight seal therebetween and are configured to be openable/closable.

The processing apparatus 22 includes a processing chamber 40 which has an opening at a position corresponding to the opening 26 and can be depressurized inside, and a disc-shaped, for example, substrate mounting table 41 rotatably installed inside the processing chamber 40, for mounting a plurality of substrates W. In the present embodiment, the substrate mounting table 41 is configured to mount, e.g., six substrates W on a concentric circle. Installed at a position where the substrate W is mounted on the substrate mounting table 41 are elevating pins 42 serving as a supporting member for supporting and elevating the substrate W from the bottom. As illustrated in FIG. 2, the elevating pins 42 penetrate the substrate mounting table 41 in its thickness direction and can be moved vertically by an elevation driving mechanism (not illustrated). In a case where the substrate W is transferred, the elevating pins 42 are elevated up to a transfer position A (B), where the substrate W is received from the substrate holders 56 and 57, which will be described later, above the substrate mounting table 41, whereas in the other cases, the elevating pins 42 are sunk into the substrate mounting table 41. Further, in the present embodiment, the processing apparatus 22 serves as a film forming apparatus that performs a film forming process on the substrate W, for example.

The substrate transfer apparatus 24 includes substrate accommodation units 50 and 51 that first accommodate the plurality of substrates W transferred between the transfer chamber 11 and the processing apparatus 22; transfer mechanisms 52 and 53 that transfer the substrate W between the substrate accommodation units 50 and 51 and the processing apparatus 22; and elevating mechanisms 54 and 55 that elevate the substrate accommodation units 50 and 51 in a vertical direction. The substrate accommodation units 50 and 51 are arranged in parallel in the X-axis direction, for example, in FIG. 1, and the transfer mechanisms 52 and 53 are positioned between the processing apparatus 22 and the substrate accommodation units 50 and 51, respectively.

The transfer mechanisms 52 and 53 include the U-shaped, for example, substrate holders 56 and 57 for holding the substrate W when transferring the substrate W, and moving mechanisms 58 and 59 for moving the substrate holders 56 and 57, respectively. The substrate holders 56 and 57 are configured to be moved by the moving mechanisms 58 and between above the elevating pins 42 of the substrate mounting table 41 (transfer positions A and B) and below a substrate mounted within the substrate accommodation units 50 and 51 (standby positions C and D). Further, the moving mechanisms 58 and 59 desirably move the substrate holders 56 and 57 in a straight line so as to reduce a moving time of the substrate holders 56 and 57 between the transfer positions A and B and the standby positions C and D, and in the present embodiment, the moving mechanisms 58 and 59 are transfer rails each including, e.g., a non-illustrated driving mechanism.

Figure 3:
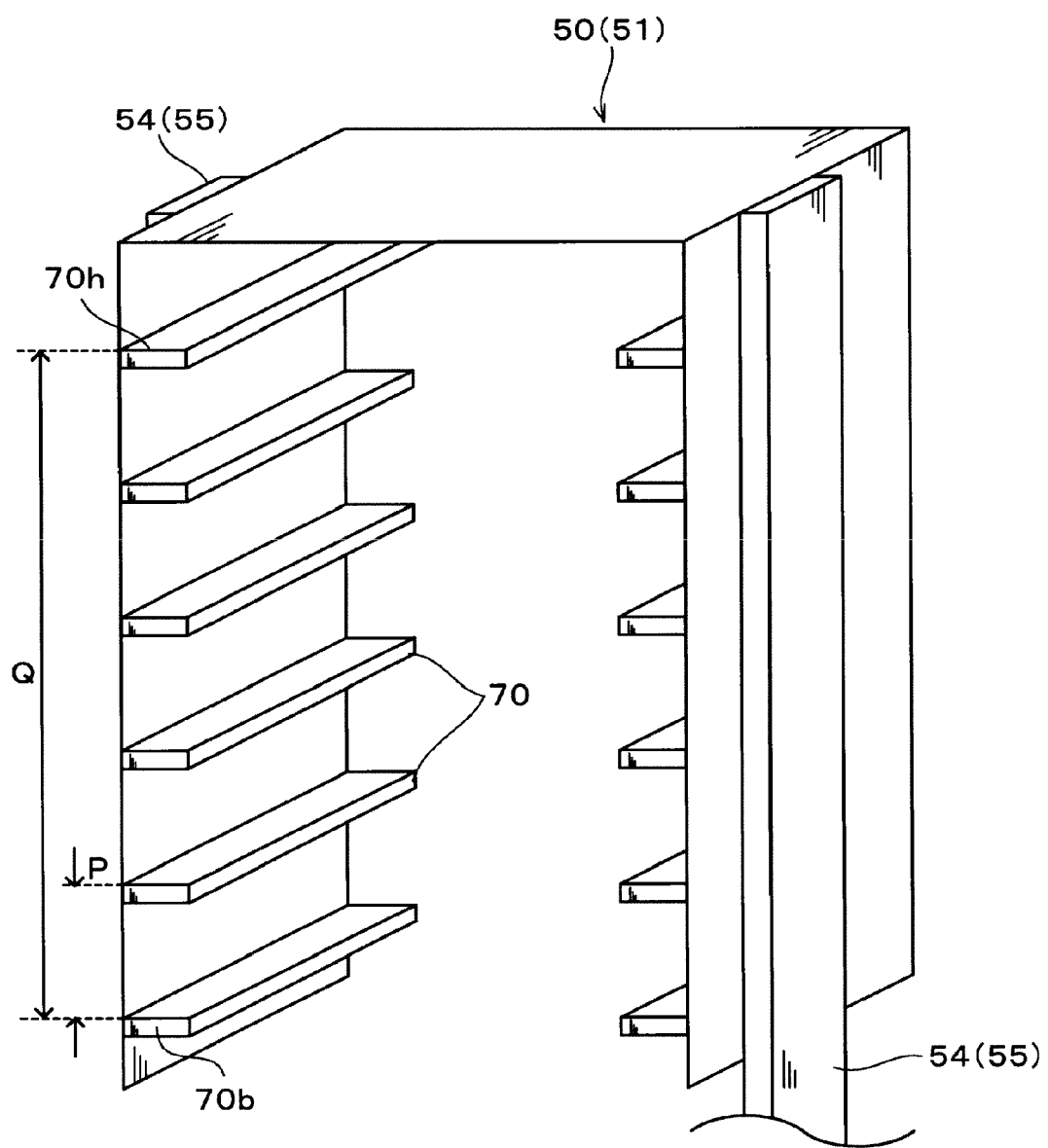
FIG. 3 is an explanatory view showing a schematic configuration of a substrate accommodation unit.
Figure 4:
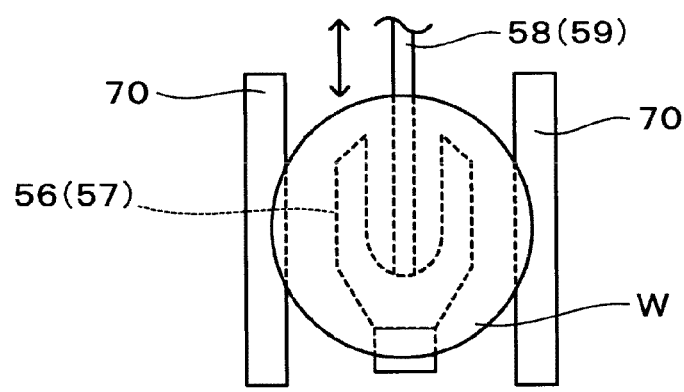
FIG. 4 is an explanatory view showing a positional relationship between a support and a substrate holder.

The substrate accommodation units 50 and 51 are formed into a substantially rectangular column shape with, e.g., open side surfaces facing the transfer chamber 11 and the processing apparatus 22, respectively and an open bottom surface as illustrated in FIG. 3. At the closed side surfaces of the substrate accommodation units 50 and 51, flat plate-shaped supports 70 for supporting the substrate W are installed in a vertical direction, for example, in a multi-stage at a predetermined, equal distance P and these supports 70 are configured to receive the plurality of substrates W. The supports 70 are positioned not to be overlapped with the substrate holders 56 and 57 when viewed from the top as illustrated in FIG. 4, for example, such that when the substrate accommodation units 50 and 51 are elevated by the elevating mechanisms 54 and 55, the supports 70 do not interfere with the substrate holders 56 and 57, respectively. The elevating mechanisms 54 and 55 are configured such that when the substrate accommodation units 50 and 51 are elevated, a lower end support 70b can be raised to a position (hereinafter, referred to as "raised position") above the substrate holders 56 and 57 of the transfer mechanisms 52 and 53 and an upper end support 70h can be lowered to a position (hereinafter, referred to as "lowered position") below the substrate holders 56 and 57 of the transfer mechanisms 52 and 53. That is, the elevating mechanisms 54 and 55 are configured to elevate the substrate accommodation units 50 and 51 through at least a distance Q between the upper end support 70h and the lower end support 70b of the substrate accommodation units 50 and 51.

Further, in the present embodiment, the substrate accommodation units 50 and 51 include multi-stage shelves capable of concurrently accommodating, e.g., six substrates corresponding to the number of the substrates W on which a batch process can be performed in the processing apparatus 22. In this way, the number of the substrates W to be accommodated in the substrate accommodation units 50 and 51 is set to be the same as that of the substrates W on which a batch process can be performed in the processing apparatus 22 in order to achieve a compact design of the apparatus and improvement in throughput of the apparatus. Further, the substrate transfer device 14 in charge of transferring the substrate under atmospheric pressure conditions desirably includes multiple pick units 100 in the same manner as, e.g., an arm 101, which will be described later, so as to concurrently transfer the same number of substrates as that of the substrates on which a batch process can be performed in the processing apparatus 22 and that of the substrates to be temporarily accommodated in the substrate accommodation units 50 and 51. With this configuration, the apparatus does not need to be scaled up, so that it is possible to improve overall throughput of the batch-type processing apparatus. The supports 70 may be formed and arranged in any other suitable manner to support the substrate W but not to be overlapped with the substrate holders 56 and 57 when viewed from the top.

Since the configuration of the processing apparatus 23 is the same as that of the above-described processing apparatus 22, redundant descriptions thereof will be omitted herein. The processing apparatuses 22 and 23 are not limited to the film forming apparatus and can be, for example, a coating apparatus, an etching apparatus, a plasma processing apparatus or the like. Further, the processing apparatus 22 and the processing apparatus 23 may be different apparatuses from each other.

The substrate transfer apparatus 24 in accordance with the present embodiment is configured as described above. Hereinafter, there will be explained operations carried out in the substrate processing system 1 including this substrate transfer apparatus 24.

When a process is performed on the substrate W, unprocessed substrates W are first taken out one by one by the arm 15 of the substrate transfer device 14 from the cassette C of the cassette station 2 and then transferred to the alignment unit 12. After the substrates W are aligned by the alignment unit 12, they are transferred by the substrate transfer device 14 so as to be accommodated in sequence from the bottom upwardly on the supports 70 of the substrate accommodation unit 50 inside the load lock chamber 20.

When the substrates W are completely accommodated in the substrate accommodation unit 50, the substrate transfer device 14 is moved out of the load lock chamber 20, and the gate valve 27 installed at the atmospheric atmosphere side of the load lock chamber 20, i.e., at the transfer chamber side is closed. Thereafter, the inside of the load lock chamber 20 is evacuated and depressurized to a predetermined pressure level.

Subsequently, by opening the gate valve 28 installed between the load lock chamber 20 and the processing chamber 40, the inside of which is maintained in a vacuum state, the substrate W in the substrate accommodation unit 50 is loaded into the processing chamber 40 by the transfer mechanism 52.

Figure 5:
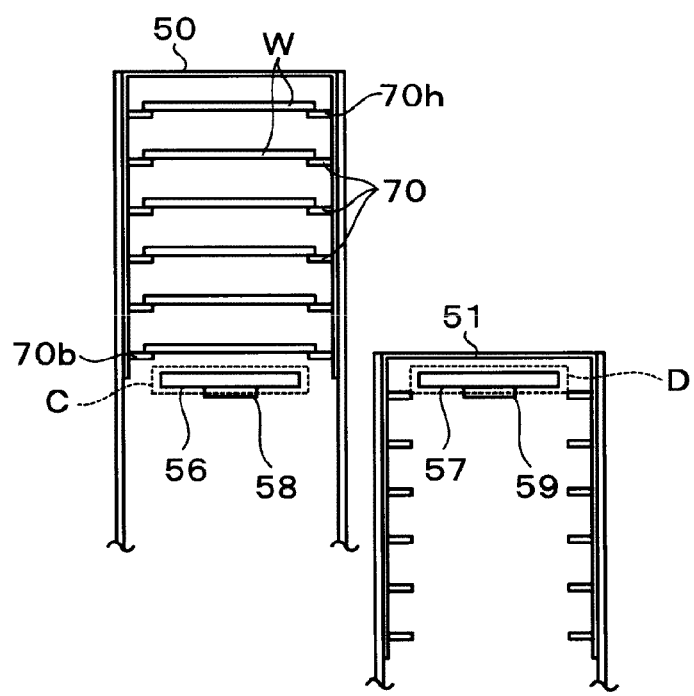
FIG. 5 is an explanatory view showing states where the substrate holder is moved to a raised position and to a lowered position, respectively.
Figure 6:
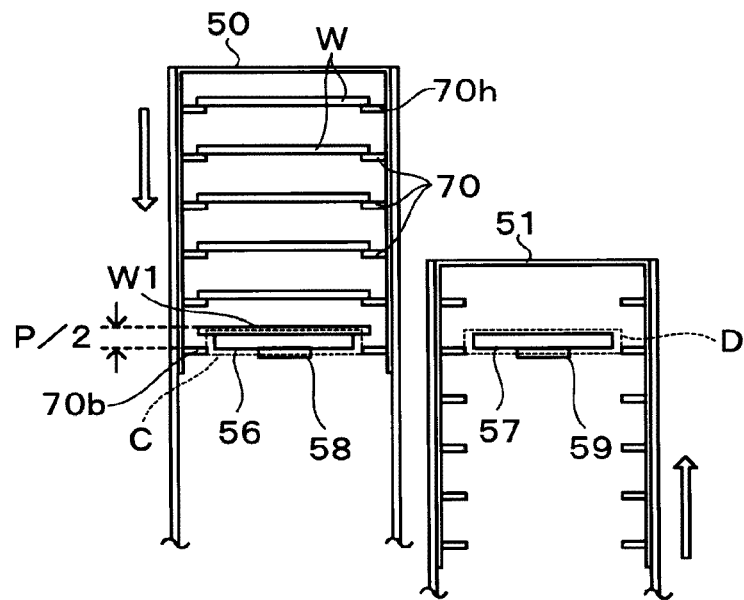
FIG. 6 is an explanatory view showing a state where a substrate is transferred to the substrate holder.

An operation of loading the substrate W into the processing chamber 40 will be explained in detail. When the substrate W is loaded into the processing chamber 40, the substrate accommodation unit 50 is first raised to the raised position by the elevating mechanism 54. At the same time, the substrate accommodation unit 51 is lowered to the lowered position by the elevating mechanism 55 (see FIG. 5). Then, the substrate holders 56 and 57 are moved to the standby positions C and D, respectively. Thereafter, the substrate accommodation unit 50 is lowered near a position where a bottom surface of a substrate $W_1$ mounted on the support 70b is in direct contact with a top surface of the substrate holder 56. Then, from here, the substrate accommodation unit 50 is further lowered by a shorter distance than a distance P between the adjacent supports 70, e.g., about a half of the distance P. At the same time, the substrate accommodation unit 51 is raised up by the same distance as the substrate accommodation unit 50 is lowered (see FIG. 6). At this time, the support 70 is positioned at the position where it is not overlapped with the substrate holder 56 when viewed from the top, so that by lowering the substrate accommodation unit 50 by about a half of the distance P, the support 70 does not interfere with the substrate holder 56 and can be in vertically alternate positions. Further, while they pass each other, the substrate W1 mounted on the support 70b is transferred to the substrate holder 56.

Figure 7:
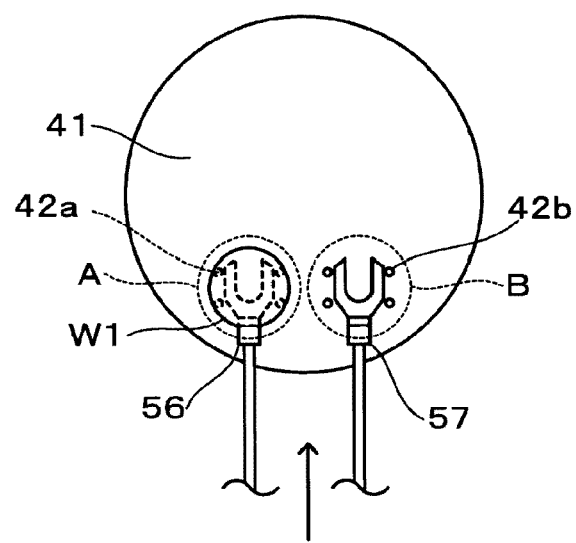
FIG. 7 is an explanatory view showing a state where the substrate holder is moved to a transfer position.
Figure 8:
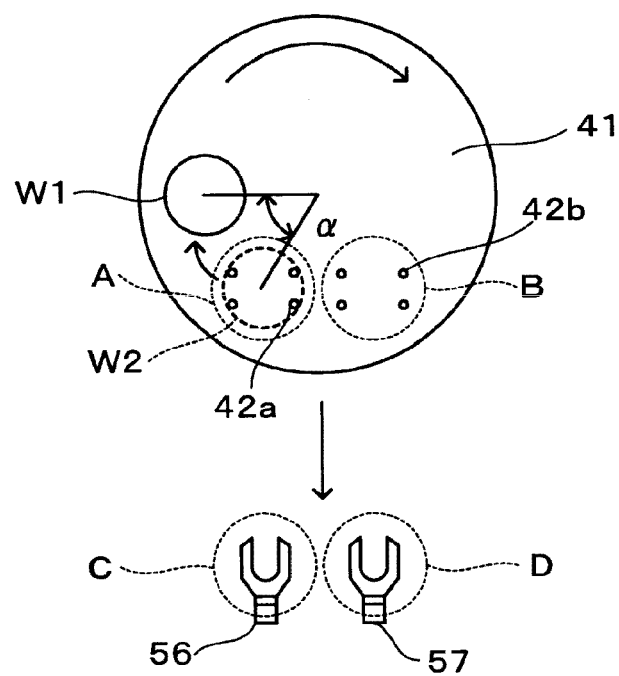
FIG. 8 is an explanatory view showing a state where a substrate mounting table is rotated at a predetermined angle after the substrate is mounted on the substrate mounting table.

The substrate holder 56 which holds the substrate W1 and the substrate holder 57 which does not hold the substrate W are introduced into the processing chamber 40 from the load lock chamber 20 by the transfer mechanism 52 via the opening 26, and both are on standby at the transfer positions A and B, i.e., above elevating pins 42a and 42b (see FIG. 7). Subsequently, the elevating pins 42a are raised from the substrate mounting table 41, so that the substrate W is transferred onto the elevating pins 42a from the substrate holder 56. When the substrate W1 is completely transferred to the elevating pins 42a, the substrate holder 56 and 57 are moved back from the inside of the processing chamber 40 to the load lock chamber 20 and moved up to the standby positions C and D. At the same time, the elevating pins 42a are lowered, and, thus, the substrate W1 supported by the elevating pins 42a is mounted onto the substrate mounting table 41. Thereafter, the substrate mounting table 41 is rotated clockwise at a predetermined angle $\alpha$ (see FIG. 8), for example. Further, the angle $\alpha$ is obtained by dividing a round angle ($2\pi$) of the substrate mounting table 41 by the number n of the substrates W to be mounted on the substrate mounting table 41.

Figure 9:
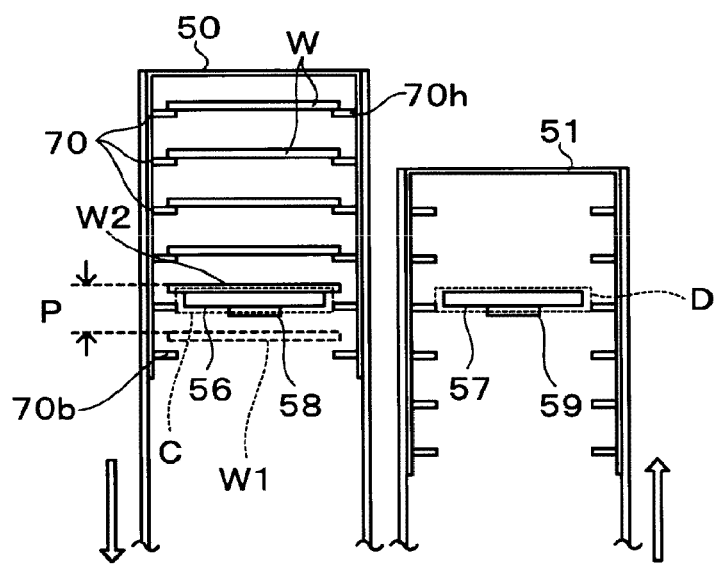
FIG. 9 is an explanatory view showing a state where the substrate is transferred to the substrate holder.

Then, while the substrate holders 56 and 57 are on standby at the standby positions C and D, the substrate accommodation units 50 and 51 are lowered and raised again, respectively, by the distance P so as to transfer a second substrate W2 to the substrate holder 56 (see FIG. 9). Subsequently, the substrate W2 is introduced into the processing chamber 40 again by the transfer mechanism 52. At this time, the substrate mounting table 41 has been rotated clockwise at the predetermined angle $\alpha$, so that the substrate W2 can be mounted on a position where the substrate W1 was mounted as indicated by a dashed line in FIG. 8 and the substrate W2 is transferred to the elevating pins 42a at the transfer position A and mounted on the substrate mounting table 41. By repeating this operation on a substrate W3 to a substrate W6, all the substrates W1 to W6 in the substrate accommodation unit 50 are loaded into the processing chamber 40.

When all the substrates W are loaded into the processing chamber 40, the gate valve 28 is closed. Then, a film forming process is performed on the respective substrates W1 to W6. While the substrates W are processed in the processing apparatus 22, the substrate accommodation unit 50, which is empty since all the substrates W1 to W6 are completely transferred therefrom, is raised up to the raised position and receives new unprocessed substrates W1 to W6 by the arm 15.

When the film forming process is completed in the processing apparatus 22, the gate valve 28 is opened. Then, a processed substrate Wa is unloaded from the processing chamber 40 by the transfer mechanism 53 and received in the substrate accommodation unit 51, whereas the unprocessed substrate W is loaded into the processing chamber 40 from the substrate accommodation unit 50. In this manner, the substrates W are replaced with each other.

Figure 10:
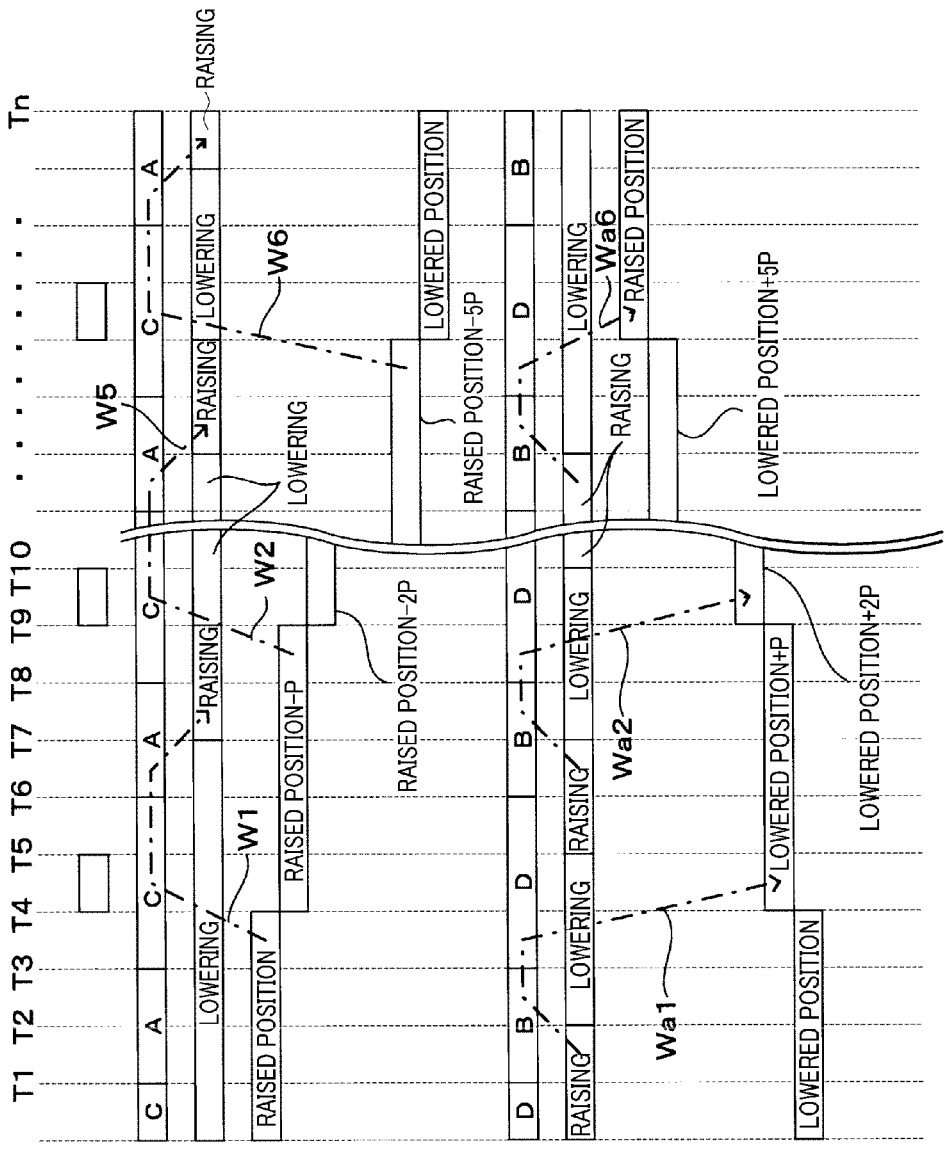
FIG. 10 is a time chart showing replacement of substrates.

There will be explained the replacement between the substrate Wa and the substrate W. FIG. 10 is a time chart showing the replacement between the substrate W and the substrate Wa. In FIG. 10, A to D show that the substrate holders 56 and 57 are positioned at the transfer positions A and B or the standby positions C and D, and a dashed dotted arrow shows where the substrates W and Wa are positioned. A section of each of the substrate accommodation units 50 and 51 illustrates a position of each of the substrate holders 56 and 57 in a height direction within the substrate accommodation units 50 and 51 in order to show a change in a position of each of the substrate accommodation units 50 and 51 in the height direction when the substrate accommodation units 50 and 51 are lowered and raised from the raised position and the lowered position, respectively, by the distance P.

Figure 11:
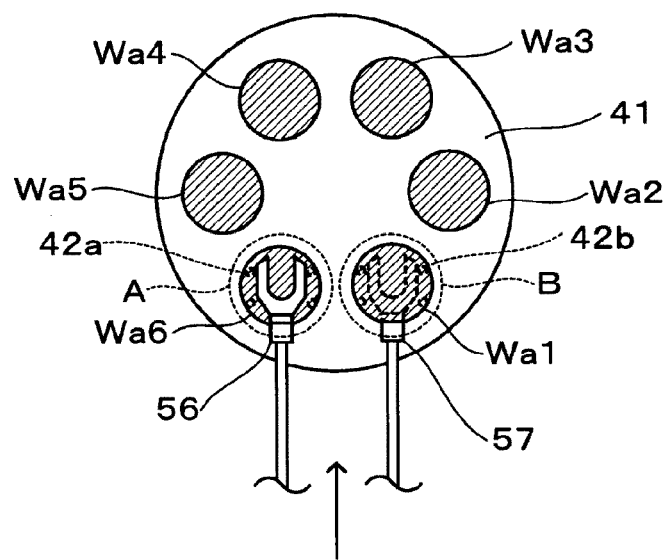
FIG. 11 is an explanatory view of a state where the substrate is transferred from elevating pins to the substrate holder.
Figure 12:
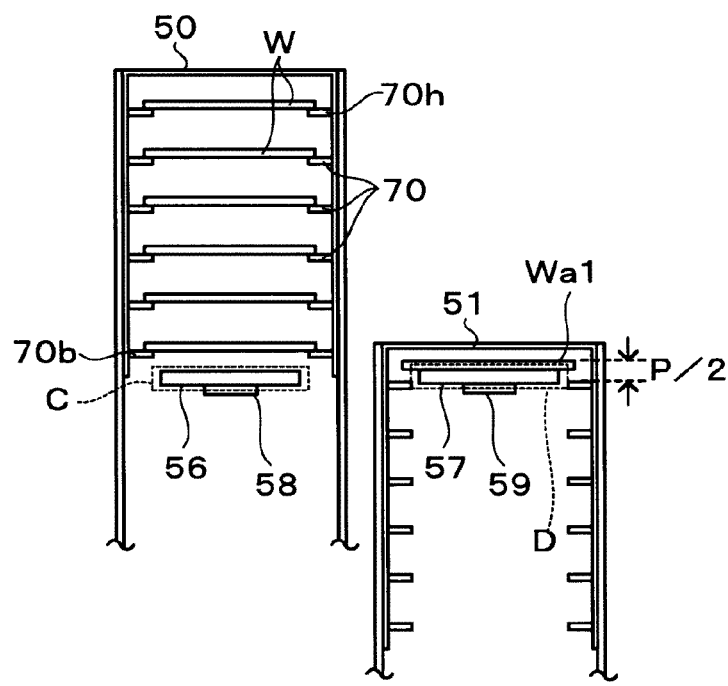
FIG. 12 is an explanatory view of states where a substrate accommodation unit is positioned at a raised position and a lowered position, respectively.
Figure 13:
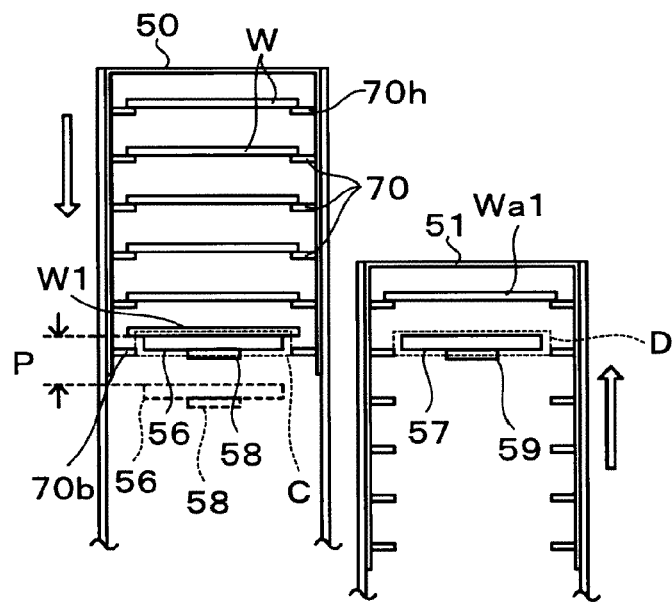
FIG. 13 is an explanatory view showing a state where a substrate is transferred between a substrate accommodation unit and a substrate holder.

A substrate Wa1 on which a film forming process has been performed in the processing chamber 40 is raised to the transfer position B by the elevating pins 42b (see T1 in FIG. 10). Subsequently, the substrate holders 56 and 57 of the transfer mechanisms 52 and 53 move to the transfer positions A and B (see T2 in FIG. 10) and, as they are, the elevating pins 42b are lowered, whereby the substrate Wa1 is transferred from the elevating pins 42b to the substrate holder 57 (see T3 in FIG. 10 and FIG. 11). Thereafter, the substrate holders 56 and 57 of the transfer mechanisms 52 and 53 are moved back to the load lock chamber 20 from the inside of the processing chamber 40 and moved to the standby positions C and D (see T4 in FIG. 10). At this time, the substrate accommodation unit 51 is moved to the lowered position in advance by the elevating mechanism 55 such that the support 70h is positioned below the standby position D (see FIG. 12). Then, the substrate accommodation unit 51 is raised by the distance P, whereas the substrate accommodation unit 50 is lowered by the same distance, i.e., the distance P in a reverse direction of the substrate accommodation unit 51 (see T5 in FIG. 10). Accordingly, the substrate Wa1 is transferred from the substrate holder 57 to the substrate accommodation unit 51, and at the same time, the substrate W is transferred from the substrate accommodation unit 50 to the substrate holder 56 (see T5 in FIG. 10 and FIG. 13). Although it is illustrated in FIGS. 9 and 13 that the substrate holder 56 is raised up from a position indicated by a dashed line to a position indicated by a solid line, this just shows a change in a relative position between the substrate accommodation unit 50 and the substrate holder 56 in a height direction for the convenience of illustration. It is not the substrate holder 56 but the substrate accommodation unit 50 that actually moves.

Figure 14:
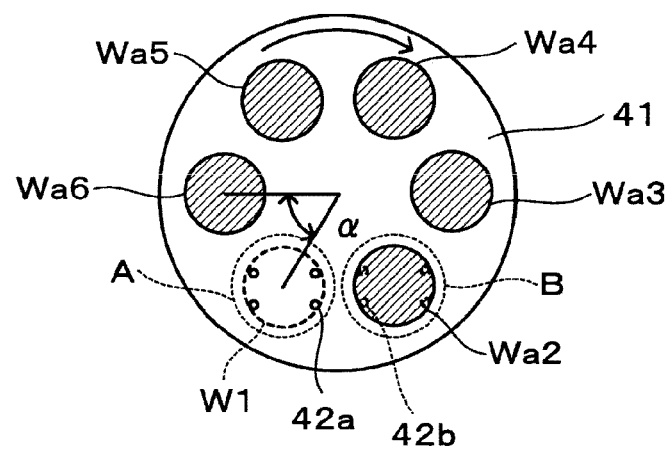
FIG. 14 is an explanatory view showing a state where the substrate mounting table is rotated at a predetermined angle after the substrate is unloaded.

The substrate holders 56 and 57 are moved back to the load lock chamber 21 and at the same time, the substrate mounting table 41 is rotated clockwise at the predetermined angle $\alpha$. Accordingly, a new unprocessed substrate W1 can be mounted on a position of the substrate mounting table 41 below the transfer position A (see FIG. 14). Then, after a rotation of the substrate mounting table 41 is finished, the elevating pins 42b are raised and the substrate Wa2 is on standby with a support by the elevating pins 42b (see T6 in FIG. 10). Thereafter, the substrate holder 56 which holds the unprocessed substrate W1 and the substrate holder 57 which does not hold the substrate are introduced into the processing chamber 40 (see T7 in FIG. 10). Subsequently, the processed substrate Wa2 is transferred from the transfer position B to the substrate holder 57 by lowering the elevating pins 42b, whereas the unprocessed substrate W1 is transferred from the transfer position A to the elevating pins 42a by raising the elevating pins 42a (see T8 in FIG. 10). Then, the substrate holders 56 and 57 are moved back to the load lock chamber 20 and moved to the standby positions C and D (see T9 in FIG. 10). Thereafter, the substrate accommodation units 50 and 51 are lowered and raised, respectively, so that the substrate W2 is transferred from the substrate accommodation unit 50 to the substrate holder 56 and the substrate Wa2 is transferred from the substrate holder 57 to the substrate accommodation unit 51 (see T10 in FIG. 10). Accordingly, between T8 and T10 in FIG. 10, for example, the substrate Wa1 is transferred from the substrate holder 57 to the substrate accommodation unit 51 and at the same time, the substrate W is transferred from the substrate accommodation unit 50 to the substrate holder 56. Further, at the same time, the substrate mounting table 41 is rotated clockwise at the predetermined angle α, and these operations are performed until Tn in FIG. 10 when all the substrates W and Wa are completely replaced. Thereafter, the film forming process is performed again when all the substrates within the processing chamber 40 are replaced with unprocessed substrates W.

Then, the processed substrate Wa is transferred from the substrate accommodation unit 51 to the arm 15 during the film forming process and returned to the cassette C. At the same time, a new unprocessed substrate W is accommodated in the substrate accommodation unit 50 by the arm 15. In this way, a series of the operations is completed, and these operations are repeatedly performed. The process performed in the processing apparatus 23 is the same as the process performed in the processing apparatus 22, and, thus redundant descriptions thereof will be omitted herein.

In view of the above-described embodiment, the substrate accommodation unit 50 for accommodating the plurality of unprocessed substrates W to be loaded into the processing apparatus; the transfer mechanism 52 for loading the substrate W in the substrate accommodation unit 50 into the processing apparatus 22; the transfer mechanism 53 for unloading the processed substrate Wa from the processing apparatus 22; and the substrate accommodation unit 51 for accommodating the plurality of unloaded substrates Wa are independently installed, so that loading of the unprocessed substrate W from the cassette C into the substrate accommodation unit 50 and unloading of the substrate Wa accommodated in the substrate accommodation unit 51 to the cassette C can be performed while substrate W is processed in the processing apparatus 22. Therefore, there is no standby time needed for the processing apparatus due to the replacement of the substrates W and Wa in the substrate accommodation units 50 and 51. Further, the substrate holders 56 and 57 move the shortest distance along a straight line between the substrate accommodation units 50 and 51 and the processing apparatus 22, so that it is possible to reduce a time for transferring the substrates W and Wa.

Furthermore, the supports 70 of the substrate accommodation units 50 and 51 are provided at positions where they are not overlapped with the substrate holders 56 and 57 when viewed from the top and the substrate accommodation units 50 and 51 are configured to be elevated by the elevating mechanisms 54 and 55. Thus, if the substrate accommodation units 50 and 51 move the distance P in a vertical direction which is an interval between the supports 70 when the substrate holders 56 and 57 has been introduced into the substrate accommodation units 50 and 51, i.e., on standby positions C and D, the substrates W and Wa can be transferred from/to the supports 70 while the substrate holders 56 and 57 and the supports 70 passed each other. Therefore, in case, for example, the substrate W is transferred to the upper end support 70h of the substrate accommodation unit 50, there is no need to revolve or vertically move through a distance Q in a height direction of the substrate accommodation unit 50, for example, as a conventional transfer arm.

Moreover, the substrate Wa can be unloaded from the processing apparatus 22 while the substrate W is loaded into the processing apparatus 22. Accordingly, by reducing a time for replacing the substrates W and Wa between the processing apparatus 22 and the substrate accommodation units 50 and 51, throughput of the substrate processing system 1 can be further improved.

In the above embodiment, the elevating mechanisms 54 and 55 are installed with respect to the substrate accommodation units 50 and 51, respectively. However, one elevating mechanism, for example, may be installed with respect to the substrate accommodation units 50 and 51 and a gear, for example, serving as a driving force transmission mechanism for dividing and transmitting a driving force of the elevating mechanism may be installed. Further, the substrate accommodation unit 50 and the substrate accommodation unit 51 may be configured to move in a reverse direction to each other at the same time in a vertical direction. Accordingly, there is no need to install the independent elevating mechanisms 54 and 55 for the substrate accommodation units 50 and 51, so that it is possible to compactly design the substrate transfer apparatus 24.

Figure 15:
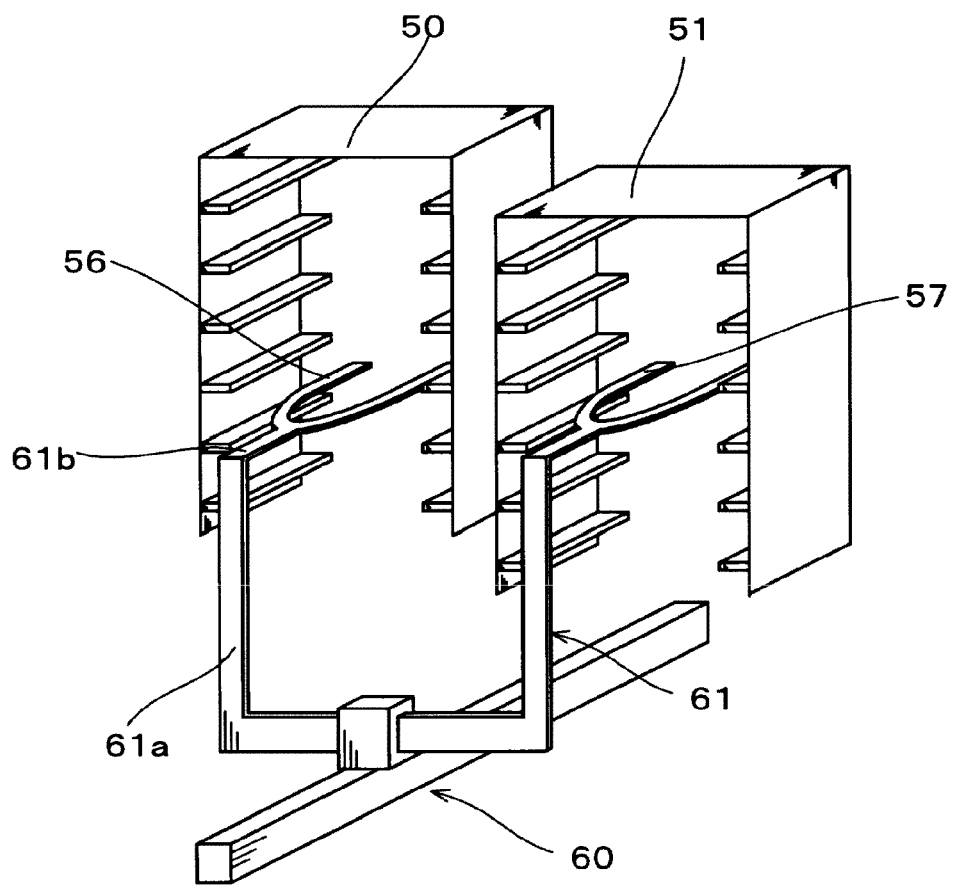
FIG. 15 is an explanatory view of the substrate holder having a connecting member.

Instead of the moving mechanisms 58 and 59 installed with respect to the substrate holders 56 and 57, respectively, one moving mechanism 60 may be installed with respect to the substrate holders 56 and 57 as illustrated in FIG. 15. The substrate holder 56 and the substrate holder 57 may be joined to, e.g., a connecting member 61 which is formed in a substantial U shape having a downwardly protruding curve at the moving mechanism 60. In this case, there is no need to install the independent moving mechanisms 58 and 59 for the substrate holders 56 and 57, so that it is possible to compactly design the substrate transfer apparatus 24. In FIG. 15, the reason why the connecting member 61 has the substantial U shape having a downwardly protruding curve is to install a vertical portion 61a at the connecting member 61 such that the connecting member 61 do not interfere with the substrate accommodation units 50 and 51 when the substrate holders 56 and 57 move. Therefore, a shape of the connecting member 61 is not limited to the shape shown in FIG. 15 as long as it does not interfere with the substrate accommodation units 50 and 51. Further, a horizontal portion 61b of the connecting member 61 has a length which does not cause the vertical portion 61a of the connecting member 61 to interfere with the opening 26 of the load lock chamber 20 when the substrate holders 56 and 57 move to the transfer positions A and B in the processing chamber 40.

Figure 16:
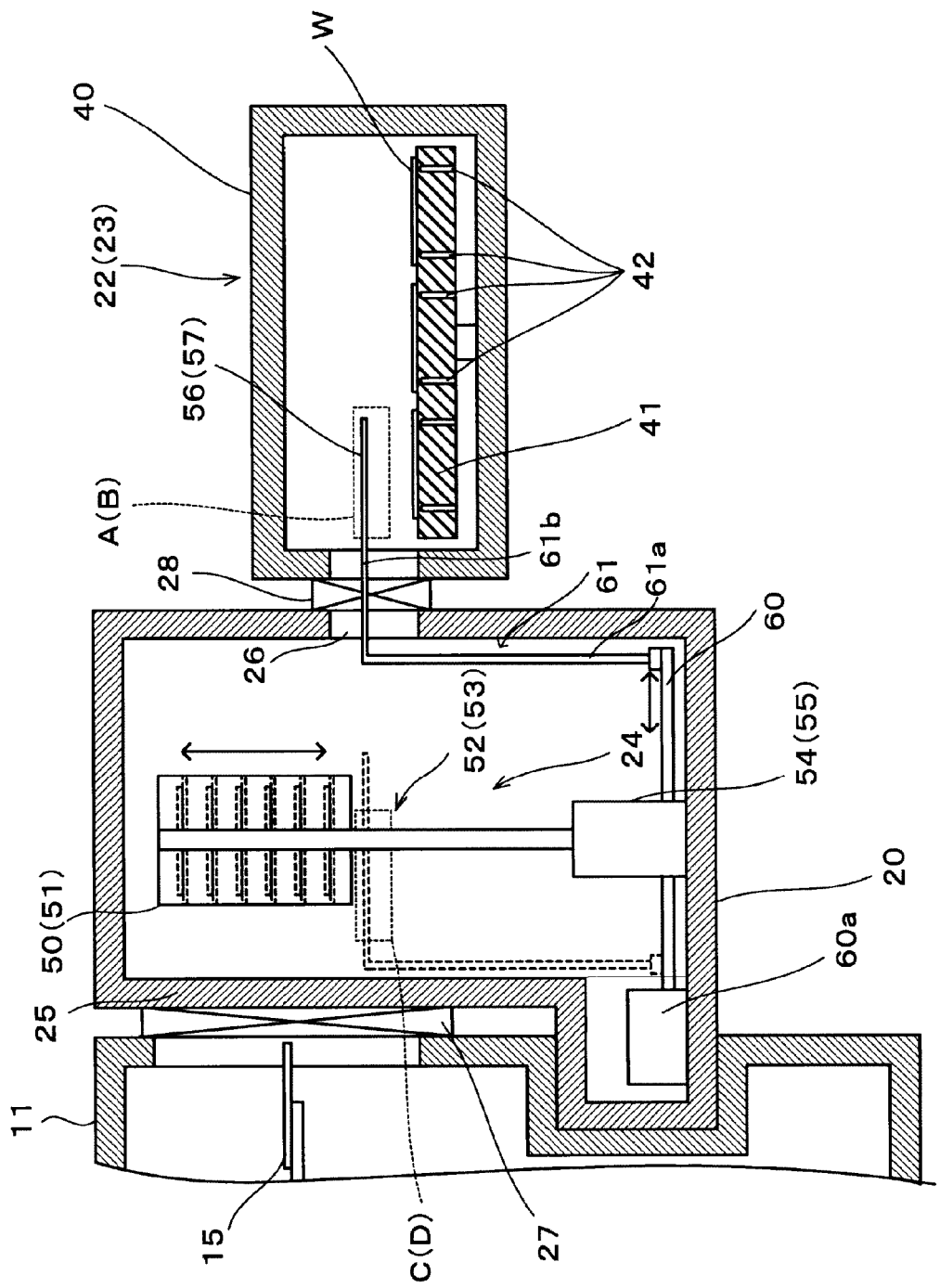
FIG. 16 is a longitudinal cross-sectional view of a schematic configuration of a substrate transfer apparatus and a processing apparatus in accordance with another embodiment.

In case of using the connecting member 61, a driving unit 60a of the moving mechanism 60 is positioned below the opening 25 of the load lock chamber 20, Accordingly, in this case, if the driving unit 60a, for example, is positioned at a space which protrudes toward the transfer chamber 11 and is located below the opening 25 of the load lock chamber 20 at the side of the transfer chamber 11 as illustrated in, e.g., FIG. 16, it is possible to arrange the moving mechanism 60 without changing a size of the load lock chamber 20.

Figure 17:
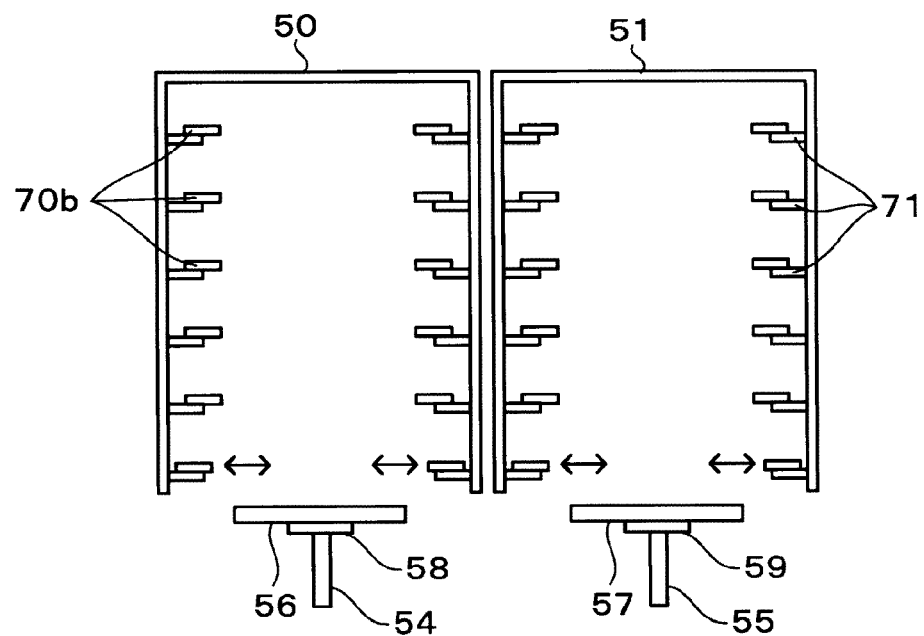
FIG. 17 is an explanatory view of a schematic configuration of the substrate accommodation unit including a support moving mechanism.

In the above-described embodiment, the substrate accommodation units 50 and 51 are elevated by the elevating mechanisms 54 and 55, respectively. However, as illustrated in, e.g., FIG. 17, it may be possible to install a support moving mechanism 71 that moves the supports 70 of the substrate accommodation units 50 and 51 between an inner side and an outer side of the substrates W and Wa, i.e., in the X-axis direction of FIG. 1 and the substrate holders 56 and 57 may be elevated by the elevating mechanisms 54 and 55.

Figure 18:
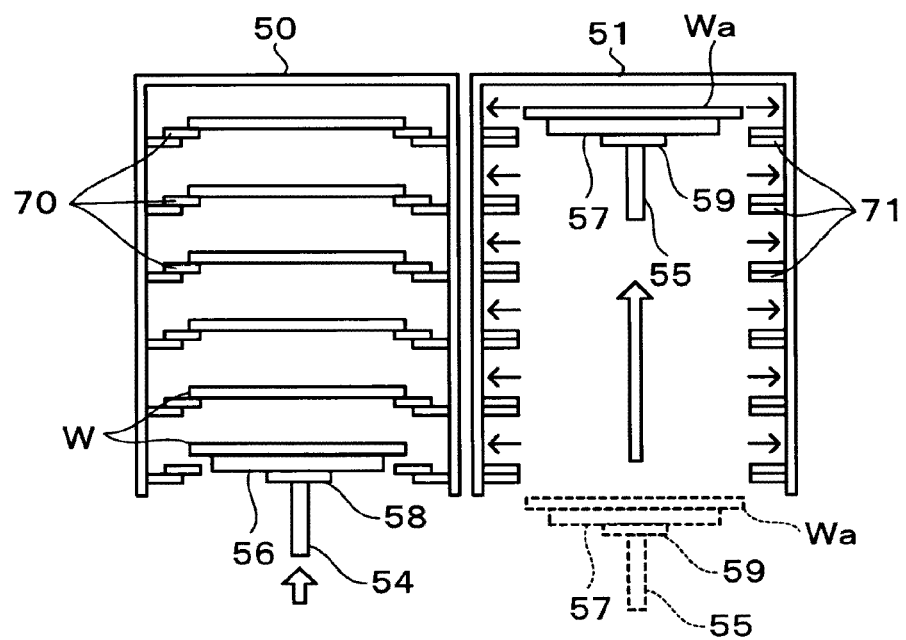
FIG. 18 is an explanatory view of a state where the substrate holder is raised up to the substrate at a predetermined height.

When the substrate W and the substrate Wa are transferred to the substrate accommodation units 50 and 51, respectively, by the substrate transfer apparatus 24 configured as stated above, the substrate holders 56 and 57 are moved to the standby positions C and D, respectively while the substrate Wa is held by, e.g., the substrate holder 57. Subsequently, as illustrated in, e.g., FIG. 18, the substrate holder 57 is raised up to a predetermined height while the support 70 is moved back by the support moving mechanism 71 to a position where the support 70 is not overlapped with the substrate Wa when viewed from the top, i.e., from the inner side to the outer side of the substrate Wa. At the same time, by raising the substrate holder 56 to a predetermined height, the substrate W is transferred from the support 70 to the substrate holder 56. Further, as illustrated in, e.g., FIG. 18, when the substrate holder 56 is raised, it does not hold the substrate W. Accordingly, since the substrate W does not interfere with the support 70, there is no need to move back the support 70 of the substrate accommodation unit 50 at this time.

Figure 19:
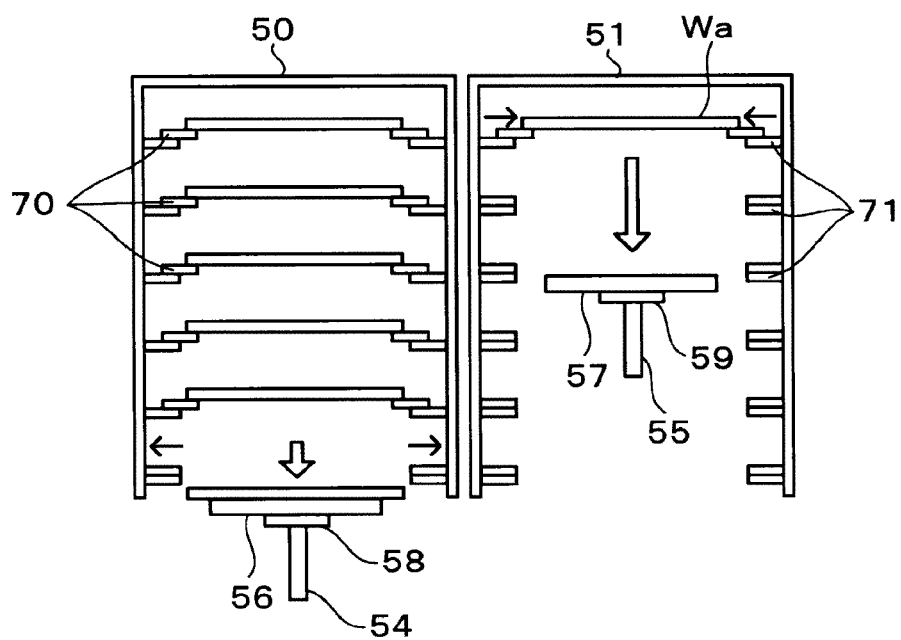
FIG. 19 is an explanatory view of a state where the substrate is transferred between the substrate accommodation unit and the substrate holder.

After the substrate holders 56 and 57 are raised to the predetermined heights, the support 70 in the substrate accommodation unit 50 is moved back to a position where the support 70 does not interfere with the substrate W, and then the substrate holder 56 is lowered. In the substrate accommodation unit 51, the support 70 is returned to a position where it was before being moved back, and then the substrate holder 57 is lowered so as to transfer the substrate Wa to the support 70 (see FIG. 19). Accordingly, the substrate holder 57 is raised via a space between the supports 70 while holding the substrate Wa and then performs the transfer of the substrate Wa. In this case, there is no need for the transfer arm to perform a revolving operation which has been made by a conventional transfer arm between the substrate accommodation units 50 and 51 serving as buffer areas and the processing apparatus 22 when a substrate is transferred. Therefore, it is possible to reduce a time for replacing the substrates W and Wa between the processing apparatus 22 and the substrate accommodation units 50 and 51. Accordingly, throughput of the substrate processing system 1 can be improved.

Figure 20:
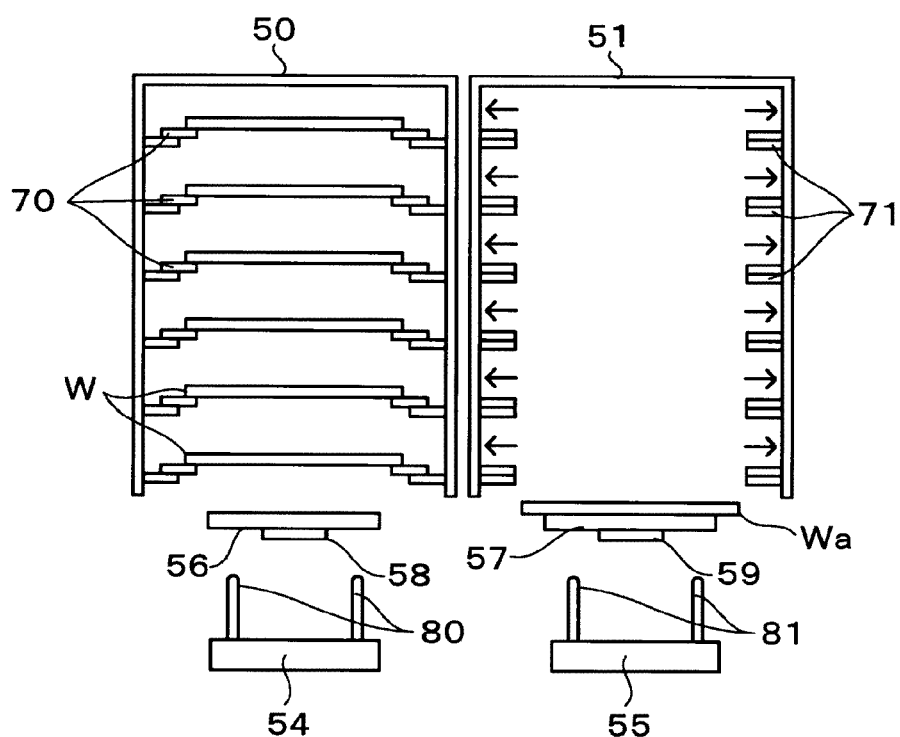
FIG. 20 is an explanatory view of a schematic configuration of the substrate accommodation unit including supporting pins below the substrate accommodation unit.
Figure 21:
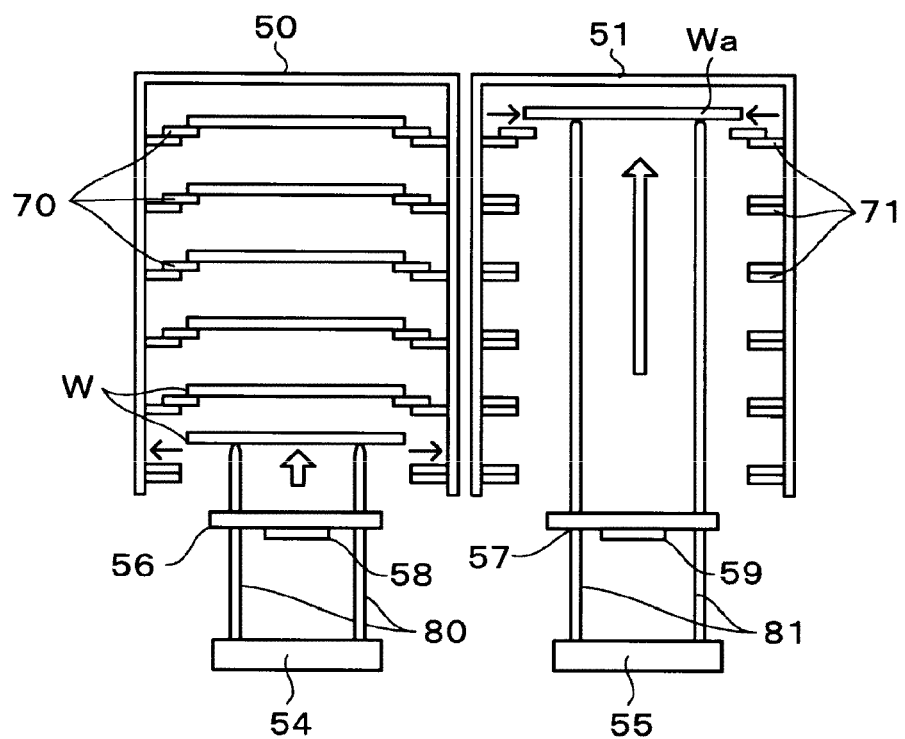
FIG. 21 is an explanatory view of a state where the substrate is supported by the supporting pins while a support is moved back.

In addition to the above-described method of moving the substrate accommodation units 50 and 51 up and down as well as elevating the substrate holders 56 and 57 after the support 70 moves back, for example, the substrates W and Wa can be transferred between the substrate accommodation units 50 and 51 and the substrate holders 56 and 57 by installing supporting pins 80 and 81, serving as another supporting units for supporting the substrates W and Wa, below the substrate accommodation units 50 and 51 and elevating the supporting pins 80 by the elevating mechanisms 54 and 55 as illustrated in FIG. 20. To be specific, the supporting pins 80 and 81 are installed at a position, where the supporting pins 80 and 81 do not interfere with the substrate holders 56 and 57 when the substrate holders 56 and 57 move from the standby positions C and D toward the processing apparatus 22, below the substrate accommodation units 50 and 51 including the support moving mechanism 71 that moves back the supports to a position, e.g., where the supports 70 do not interfere with the substrates W and Wa. Further, for example, the substrate holder 56 is moved to the standby position C while it does not hold the substrate W, and then the supporting pins 80 are raised so as to support the substrate W. At the same time, the substrate holder 57 is moved to the standby position D while it holds the substrate Wa, and then the supporting pins 81 are raised so as to support the substrate Wa (see FIG. 21). Subsequently, when the supports 70 are moved back in the substrate accommodation unit 50 and then the supporting pins 80 are lowered, the substrate W is transferred between the supporting pins 80 and the substrate accommodation unit 50. In the substrate accommodation unit 51, the supports 70 are returned to a position where it was before being moved back, and then the supporting pins 81 are lowered, and thus, the substrate Wa is transferred between the supporting pins 81 and the supports 70. At this time, the supporting pins 80 and 81 are installed at positions where the supporting pins 80 and 81 do not interfere with the substrate holders 56 and 57 when the substrate holders 56 and 57 are moved from the standby positions C and D toward the processing apparatus 22. Therefore, if when the substrate W is transferred from the substrate accommodation unit 50 to the substrate holder 56, for example, the substrate W is supported in advance by the supporting pins 80 at a position higher than the standby position C by P/2, the substrate W can be transferred between the substrate accommodation unit 50 and the substrate holder 56 by the minimum operation, i.e., by lowering the supporting pins by a half of the distance P after the substrate holder 56 is moved to the standby position C. Therefore, a time for replacing the substrates W and Wa between the processing apparatus 22 and the substrate accommodation units 50 and 51 can be reduced and throughput of the substrate processing system 1 can be improved.

Figure 22:
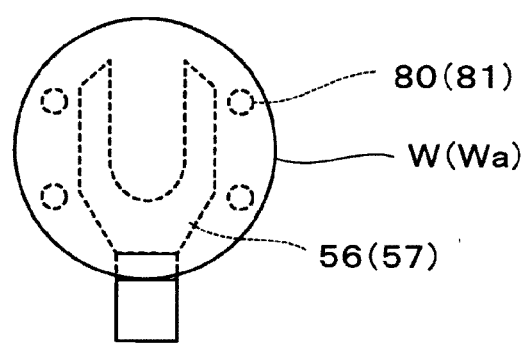
FIG. 22 is an explanatory view of a positional relationship between the substrate holder and the supporting pins.

By way of example, the supporting pins 80 may be arranged to surround the substrate holders 56 and 57 as illustrated in FIG. 22 in order not to interfere with the substrate holders 56 and 57 when the substrate holders 56 and 57 are moved from the standby positions C and D toward the processing apparatus 22.

Further, in case of using the substrate accommodation units 50 and 51 including the support moving mechanism 71 and the supporting pins 80, for example, in the transfer mechanisms 52 and 53, a standby position is set to be above the substrate accommodation units 50 and 51, and the substrate holding mechanism 56 and 57 for holding outer peripheral portions of the substrates W and Wa from the above may be positioned at the standby position.

In the above-described embodiment, although the transfer mechanisms 52 and 53 are slid by the moving mechanisms 58 and 59 in a horizontal direction, the moving mechanism may have an expandable and contractible arm in the same manner as the substrate transfer device 14, for example.

Further, in any case, there is no need for the substrate holders 56 and 57 of the transfer mechanisms 52 and 53 to move farther than a position where the substrate is transferred to the substrate accommodation units 50 and 51, i.e., to move toward the transfer chamber 11 via the standby positions C and D. Therefore, it is possible to compactly design the moving mechanism that moves the substrate holders 56 and 57.

Figure 23:
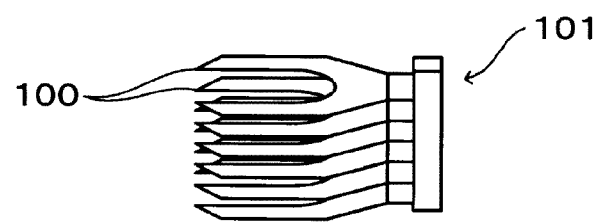
FIG. 23 is an explanatory view of a schematic configuration of an arm having multiple pick units.

Furthermore, in the above-described embodiment, the substrate is transferred between the cassette C of the cassette station 2 and the substrate accommodation units 50 and 51 by the substrate transfer device 14 having one arm 15. However, instead of the substrate transfer device 14, it may be possible to install the arm 101 having the multiple pick units 100 in a vertical direction as illustrated in FIG. 23, for example. With the arm 101 having the pick units 100 in the same number as, e.g., the number n of the substrates W and Wa to be accommodated in the substrate accommodation units 50 and 51, replacement of the substrates W and Wa between the cassette C and the substrate accommodation units 50 and 51 can be performed at once by the arm 101.

Figure 24:
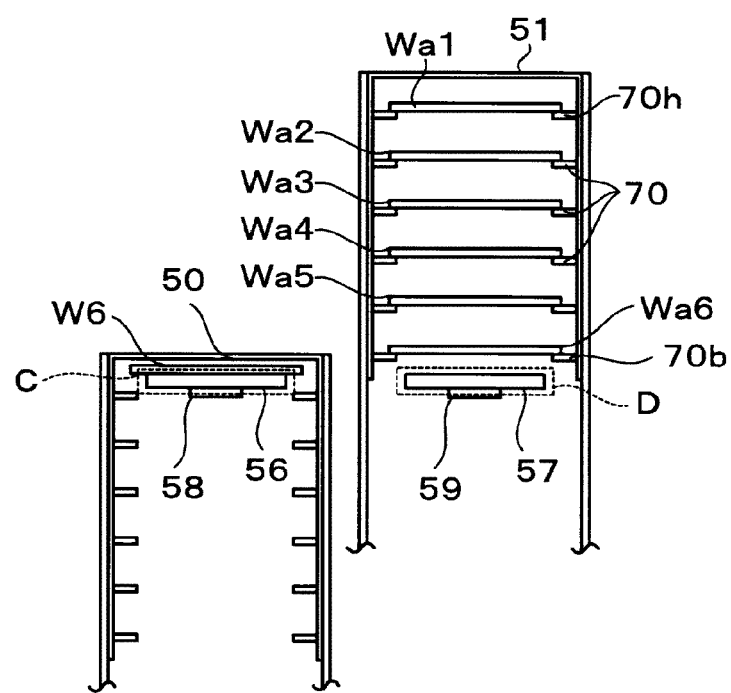
FIG. 24 is an explanatory view showing an arrangement sequence of substrates in the substrate accommodation unit.

Further, in case of loading and unloading the substrates W and Wa into/from the processing apparatus 22 by using the substrate transfer apparatus 24, the substrates W have been accommodated from the arm 15 into the substrate accommodation unit 50 in sequence from the substrate W1 from the bottom, and the substrates Wa are unloaded from the processing apparatus 22 and accommodated in the substrate accommodation unit 51 by the transfer mechanism 53 in a reverse sequence from the substrate Wa1 from the top as illustrated in FIG. 24. This is caused by that when the substrates W are unloaded from the substrate accommodation unit 50, the substrate accommodation unit 50 is lowered so as to transfer the substrates W to the substrate holder 56 in a sequence from the substrate W1, whereas when the processed substrates Wa are accommodated in the substrate accommodation unit 51, the substrate accommodation unit 50 is raised so as to transfer the substrates Wa to the supports 70 in a sequence from the substrate Wa1 from the top. A reverse sequence of the substrates Wa accommodated in the substrate accommodation unit 51 has no problem if the arm 15 is used to transfer the substrate Wa from the substrate accommodation unit 51 to the cassette C one by one, but it has a problem when the above-described arm 101 is used. When the arm 15 is used to transfer the substrates Wa from the substrate accommodation unit 51 in a sequence from the substrate Wa1 from the top, the substrates Wa are received into the cassette C in sequence from the bottom, thereby reversing a sequence of the substrates again. However, when the arm 101 is used, the substrates Wa are received into the cassette C in the same sequence as accommodated in the substrate accommodation unit 51.

As a method of preventing a sequence of the substrates Wa from being reversed in the substrate accommodation unit 51, it may be possible to unload the substrates Wa from the process chamber 40 in a sequence from a substrate Wa6 to the substrate Wa1 by rotating the substrate mounting table 41, which is rotated clockwise in the above-described embodiment, in reverse, i.e., counterclockwise after the substrates W are completely processed in the processing chamber 40, for example. In this case, the substrates Wa are unloaded by the substrate holder 56 which loaded the substrates and accommodated in the substrate accommodation unit 50 in a sequence from the substrate Wa6 from the top. At the same time, the unprocessed substrates W of the substrate accommodation unit 51 are loaded into the processing chamber 40 by the transfer mechanism 53. In this case, the substrate accommodation unit 50 and the transfer mechanism 52 alternately repeat loading and unloading operations with respect to the processing apparatus 22. In view of the substrate transfer apparatus 24 as a whole, when the substrate W is loaded into the processing apparatus 22 by the transfer mechanism 52, for example, the transfer mechanism 53 can simultaneously unload the substrate from the processing apparatus 22. Further, when the substrate W is loaded into the processing apparatus 22 by the transfer mechanism 53, for example, the transfer mechanism 52 can simultaneously unload the substrate from the processing apparatus 22. As a result, replacement between the unprocessed substrate W and the processed substrate Wa within the substrate accommodation vessel, which has been carried out conventionally, is not necessary. Therefore, throughput of the substrate processing system 1 can be improved.

In the above-described embodiment, the substrates W and Wa are accommodated in the substrate accommodation units 50 and 51. However, in case of setting the number of batch processed substrates W in a processing apparatus to be n, for example, (2n−1) supports 70 may be installed in the substrate accommodation units 50 and 51 and dummy wafers may be provided on from the upper end supports $70h$ to $(n-1)^{th}$ supports 70 of the substrate accommodation units 50 and 51. Under an interlock condition that a process is started when n sheets of the substrates W are mounted on the substrate mounting table 41 in the processing apparatus 22 for performing, e.g., n sheets of substrates, if the substrates W are less than n sheets, it is necessary to load dummy wafers in the number of difference from the outside into the processing apparatus 22. However, in this case, dummy wafers accommodated in the substrate accommodation units 50 and 51 can be loaded to the processing apparatus 22, and thus, there is no need to transfer the dummy wafers from the outside to the processing apparatus 22.

The above-described embodiment is provided for the purpose of illustration with reference to the accompanying drawings but the present invention is limited thereto. It would be understood by those skilled in the art that various changes and modifications may be made without changing technical conception and essential features of the present invention and all modifications and embodiments are included in the scope of the present invention. The present invention is not limited to the above-described embodiment and can be varied in many ways. The present disclosure can be applied to a case where a substrate is other than a wafer, such as a flat panel display (FPD), a mask reticle for a photo mask or the like. Further, the present disclosure can be applied to a case where a process performed in a processing apparatus is other than a CVD process, such as a plasma process, e.g., an etching process, or the like. Furthermore, the present disclosure is not limited to the shape of the transfer arm described in the present embodiment and thus can be applied to other various shapes of transfer arms.

INDUSTRIAL APPLICABILITY

The present disclosure is useful in transferring a substrate with respect to a processing apparatus for performing a predetermined process on the substrate.

What is claimed is:

1. A substrate transfer apparatus that transfers a substrate with respect to a batch-type processing apparatus configured to perform a batch process on a plurality of substrates, the substrate transfer apparatus comprising:

a first substrate accommodation unit configured to accommodate, in a vertical direction, a plurality of substrates to be loaded into a processing apparatus;

a second substrate accommodation unit configured to accommodate, in a vertical direction, a plurality of substrates unloaded from the processing apparatus;

a first substrate holder configured to transfer substrates from the first substrate accommodation unit to the processing apparatus;

a second substrate holder configured to transfer substrates from the processing apparatus to the second substrate accommodation unit;

a first elevating mechanism configured to move at least one of the first substrate accommodation unit and the first substrate holder in a vertical direction relative to each other in order to transfer substrates between the first substrate accommodation unit and the first substrate holder; and a second elevating mechanism configured to move at least one of the second substrate accommodation unit and the second substrate holder in a vertical direction relative to each other in order to transfer substrates between the second substrate accommodation unit and the second substrate holder, wherein one substrate is transferred from the first substrate accommodation unit to the first substrate holder, while another substrate is transferred from the second substrate holder to the second substrate accommodation unit,
in the first substrate accommodation unit, a first support for supporting the substrate is installed at a position where it is not overlapped with the first substrate holder when viewed from the top,
in the second substrate accommodation unit, a second support for supporting the substrate is installed at a position where it is not overlapped with the second substrate holder when viewed from the top,
the first substrate accommodation unit includes a first support moving mechanism that moves the first support between an inner side and an outer side of the substrate,
the second substrate accommodation unit includes a second support moving mechanism that moves the second support between an inner side and an outer side of the substrate,
the first elevating mechanism moves the first substrate holder in a vertical direction, and
the second elevating mechanism moves the second substrate holder in a vertical direction.

2. The substrate transfer apparatus of claim 1, wherein the processing apparatus includes a processing chamber in which a predetermined process is performed on a plurality of substrates under a depressurized atmosphere,
the substrate transfer apparatus is positioned in a transfer chamber capable of being depressurized inside, and
the transfer chamber has an opening through which the transfer chamber communicates airtightly with the processing chamber.

3. The substrate transfer apparatus of claim 2, wherein, at a position below the substrate transferred by the first substrate holder and a position below the substrate to be transferred by the second substrate holder, respectively, in the processing chamber, supporting devices each supporting the substrate are installed, and
the supporting devices are movable in a vertical direction.

4. The substrate transfer apparatus of claim 2, further comprising:
a first moving mechanism configured to move the first substrate holder between above a position where the substrate is mounted in the processing chamber and below the substrate in the first substrate accommodation unit; and
a second moving mechanism configured to move the second substrate holder between above a position where the substrate is received in the processing chamber and below the substrate in the second substrate accommodation unit.

5. The substrate transfer apparatus of claim 1, wherein each of the first substrate accommodation unit and the second substrate accommodation unit includes a dummy wafer mounting portion that mounts a dummy wafer on an upper portion of each of the first substrate accommodation unit and the second substrate accommodation unit.

6. A substrate processing system comprising:
a plurality of substrate transfer apparatuses as claimed in claim 1;
a transfer chamber configured to transfer substrates to the plurality of substrate transfer apparatuses; and
a batch-type processing apparatus connected to each of the plurality of substrate transfer apparatuses.

7. A substrate transfer apparatus that transfers a substrate with respect to a batch-type processing apparatus configured to perform a batch process on a plurality of substrates, the substrate transfer apparatus comprising:
a first substrate accommodation unit configured to accommodate, in a vertical direction, a plurality of substrates to be loaded into a processing apparatus;
a second substrate accommodation unit configured to accommodate, in a vertical direction, a plurality of substrates unloaded from the processing apparatus;
a first substrate holder configured to transfer substrates from the first substrate accommodation unit to the processing apparatus;
a second substrate holder configured to transfer substrates from the processing apparatus to the second substrate accommodation unit;
a first elevating mechanism configured to move at least one of the first substrate accommodation unit and the first substrate holder in a vertical direction relative to each other in order to transfer substrates between the first substrate accommodation unit and the first substrate holder;
a second elevating mechanism configured to move at least one of the second substrate accommodation unit and the second substrate holder in a vertical direction relative to each other in order to transfer substrates between the second substrate accommodation unit and the second substrate holder;
a first supporting pin configured to support the substrate in the first substrate accommodation unit; and
a second supporting pin configured to support the substrate in the second substrate accommodation unit,
wherein one substrate is transferred from the first substrate accommodation unit to the first substrate holder, while another substrate is transferred from the second substrate holder to the second substrate accommodation unit,
in the first substrate accommodation unit, a first support for supporting the substrate is installed at a position where it is not overlapped with the first substrate holder when viewed from the top,
in the second substrate accommodation unit, a second support for supporting the substrate is installed at a position where it is not overlapped with the second substrate holder when viewed from the top,
the first substrate accommodation unit includes a first support moving mechanism that moves the first support between an inner side and an outer side of the substrate,
the second substrate accommodation unit includes a second support moving mechanism that moves the second support between an inner side and an outer side of the substrate,
the first elevating mechanism moves the first supporting pin in a vertical direction, and
the second elevating mechanism moves the second supporting pin in a vertical direction.

* * * * *

UNITED STATES PATENT AND TRADEMARK OFFICE
CERTIFICATE OF CORRECTION

PATENT NO. : 8,545,160 B2  
APPLICATION NO. : 12/715497  
DATED : October 1, 2013  
INVENTOR(S) : Hiromitsu Sakaue Page 1 of 1

It is certified that error appears in the above-identified patent and that said Letters Patent is hereby corrected as shown below:

In the specification, column 13, line 61, please add -- 70 -- before "to a position"

Signed and Sealed this  
Tenth Day of December, 2013

Margaret A. Focarino  
*Commissioner for Patents of the United States Patent and Trademark Office*